United States Patent
Kudou et al.

(10) Patent No.: US 8,525,718 B2
(45) Date of Patent: Sep. 3, 2013

(54) DIFFERENTIAL AMPLIFIER AND ANALOG/DIGITAL CONVERTER

(75) Inventors: Kouhei Kudou, Nagasaki (JP);
Yasuhide Shimizu, Nagasaki (JP);
Norifumi Kanagawa, Nagasaki (JP);
Shigemitsu Murayama, Nagasaki (JP)

(73) Assignee: Sony Corporation, Tokyo (JP)

( * ) Notice: Subject to any disclaimer, the term of this patent is extended or adjusted under 35 U.S.C. 154(b) by 12 days.

(21) Appl. No.: 13/410,906

(22) Filed: Mar. 2, 2012

(65) Prior Publication Data
US 2012/0242525 A1    Sep. 27, 2012

(30) Foreign Application Priority Data

Mar. 25, 2011   (JP) ................................ 2011-067226

(51) Int. Cl.
*H03M 1/12*    (2006.01)
(52) U.S. Cl.
USPC .......................................... 341/155; 341/156
(58) Field of Classification Search
USPC ................................................ 341/155, 156
See application file for complete search history.

(56) References Cited

U.S. PATENT DOCUMENTS

| | | | | |
|---|---|---|---|---|
| 5,600,451 A * | 2/1997 | Maki | .............................. | 358/483 |
| 6,530,068 B1 * | 3/2003 | Cao et al. | ...................... | 716/106 |
| 6,542,722 B1 * | 4/2003 | Sorrells et al. | ................ | 455/110 |
| 6,570,523 B1 * | 5/2003 | Bacrania et al. | ............... | 341/155 |
| 6,812,786 B2 * | 11/2004 | Jackson et al. | ................... | 330/51 |
| 6,963,233 B2 * | 11/2005 | Puccio et al. | .................. | 327/157 |

FOREIGN PATENT DOCUMENTS

JP       2006-254419       9/2006

* cited by examiner

*Primary Examiner* — Jean B Jeanglaude
(74) *Attorney, Agent, or Firm* — Rader, Fishman & Grauer PLLC (57) ABSTRACT

Disclosed herein is a differential amplifier including: an input terminal configured to receive an input signal; an output terminal configured to output an output signal obtained as a result of amplifying the input signal; an amplification part configured to amplify the input signal to generate the output signal; a load circuit which is connected between the amplification part and a power-supply terminal, and is provided with a first-conduction transistor, and a changeover switch configured to switch a connection between a gate electrode of the first-conduction transistor and a drain electrode of the first-conduction transistor to a connection between the gate electrode and the output terminal or vice versa; and a leak cancel switch configured to generate a leak cancel current for reducing an off leak current flowing through the changeover switch.

5 Claims, 8 Drawing Sheets

DIFFERENTIAL AMPLIFIER AND ANALOG/DIGITAL CONVERTER

BACKGROUND

The present disclosure relates to a differential amplifier and an analog/digital converter making use of the differential amplifier.

In the past, with popular use of digital apparatus, there have been widely utilized analog/digital converters each used for converting an analog signal into a digital signal.

In this analog/digital converter, an input analog signal is compared with reference voltages at a plurality of stages to convert the analog signal into a digital signal. Therefor, a plurality of amplifiers are used.

Thus, the analog/digital converter is designed to make use of amplifiers each having a good characteristic. In particular, as a characteristic of such amplifiers, the analog/digital converter employs a two-stage amplifier having an offset reduction function in order to reduce an important offset voltage.

This two-stage amplifier is constructed by connecting a rear-stage differential amplifier having a variable gain to a front-stage differential amplifier having a fixed gain in series. By increasing and decreasing the gain of the differential amplifier provided at the rear stage, the offset voltage of the differential amplifier provided at the front stage appears to be reduced.

In a differential amplifier disclosed in Japanese Patent Laid-open No. 2006-254419 for example (hereinafter referred to as Patent Document 1), in a reset operation, a load circuit included in the amplifier is put in a diode-connection state decreasing the gain of the amplifier. In a comparison operation, on the other hand, the signal output by the differential amplifier is fed back to the load circuit in a positive feedback operation to increase the gain of the amplifier. Thus, the gain of the differential amplifier can be changed and vice versa without lowering the speed of the operation and without increasing the power consumption.

SUMMARY

The differential amplifier for an analog/digital converter disclosed in Patent Document 1 makes use of a changeover switch which is operated in reset and comparison operations to change the gain of the amplifier. To be more specific, in the reset operation, the changeover switch is closed and sustained in a turned-on state to put the load circuit included in the differential amplifier in a diode-connection state, decreasing the gain of the amplifier. In the comparison operation, on the other hand, the changeover switch is opened and sustained in a turned-off state to feed back the signal output by the differential amplifier to the load circuit included in the amplifier in a positive feedback operation so as to increase the gain of the amplifier.

As efforts to reduce the size of the analog circuit make progress for example, an off leak current may flow through a switch even if the switch is opened, being put in a turned-off state. By the way, the off leak current is generated not only because of the size reduction of the analog circuit but also in accordance with a process of manufacturing the circuit.

The off leak current also flows through the aforementioned changeover switch, which is used for changing the gain of the differential amplifier disclosed in Patent Document 1 described above, due to manufacturing processes including a size-reduction process. Thus, there has been undesirably raised a problem that the gain of the differential amplifier decreases and increases repeatedly in an oscillatory state during a comparison operation due to the effect of the off leak current.

It is desirable to provide a differential amplifier and an analog/digital converter employing the amplifier which is capable of eliminating the effect of an off leak current flowing through a changeover switch used to change the gain of the amplifier and, thus, capable of getting rid of the oscillatory state of the gain.

A differential amplifier provided by the present disclosure includes an input terminal configured to receive an input signal; an output terminal configured to output an output signal obtained as a result of amplifying the input signal; an amplification part configured to amplify the input signal to generate the output signal; a load circuit which is connected between the amplification part and a power-supply terminal, and is provided with a first-conduction transistor, and a changeover switch configured to switch a connection between a gate electrode of the first-conduction transistor and a drain electrode of the first-conduction transistor to a connection between the gate electrode and the output terminal or vice versa; and a leak cancel switch configured to generate a leak cancel current for reducing an off leak current flowing through the changeover switch.

A differential amplifier provided by the present disclosure includes: input terminals configured to receive input signals having normal and reverse phases; normal-phase and reverse-phase output terminals configured to output output signals obtained as a result of amplifying the input signals; a first amplification portion configured to amplify the input signal having the normal phase in order to generate the output signal having the reverse phase; a second amplification portion configured to amplify the input signal having the reverse phase to generate the output signal having the normal phase; a load circuit provided with a first transistor connected between the first amplification portion and a power-supply terminal, a first capacitive element connected between a gate electrode of the first transistor and the normal-phase output terminal, a first changeover switch to be closed to connect the gate electrode of the first transistor to the source or drain electrode of the first transistor, and to be opened to connect the gate electrode of the first transistor to the normal-phase output terminal, a second transistor connected between the second amplification portion and the power-supply terminal, a second capacitive element connected between the gate electrode of the second transistor and the reverse-phase output terminal, and a second changeover switch to be closed in order to connect the gate electrode of the second transistor to the source or drain electrode of the second transistor or to be opened in order to connect the gate electrode of the second transistor to the reverse-phase output terminal; a first cancel switch having one of its switch terminals connected to one of the element terminals of the first capacitive element and another switch terminal connected to the other element terminal of the first capacitive element in an opened state; and a second cancel switch having one of its switch terminals connected to one of the element terminals of the second capacitive element and another switch terminal connected to the other element terminal of the second capacitive element in an opened state.

In addition, an analog/digital converter provided by the present disclosure includes a plurality of amplifiers each configured to amplify a difference between the voltage of an analog signal and each of a plurality of different reference voltages to convert the analog signal into a digital signal, wherein each of the amplifiers has: an input terminal configured to receive an input signal; an output terminal configured to output an output signal obtained as a result of amplifying the input signal; an amplification part configured to amplify the input signal to generate the output signal; a load circuit which is connected between the amplification part and a power-supply terminal, and is provided with a first-conduction transistor, and a changeover switch configured to switch a connection between a gate electrode of the first-conduction transistor and a source or drain electrode of the first-conduction transistor to a connection between the gate electrode and the output terminal or vice versa; and a leak cancel switch configured to generate a leak cancel current which reduces an off leak current flowing through the changeover switch.

The differential amplifier provided by the present disclosure and the analog/digital converter employing the differential amplifier are capable of eliminating the effect of an off leak current flowing through a changeover switch used to change the gain of the amplifier and, thus, capable of getting rid of the oscillatory state of the gain.

DETAILED DESCRIPTION OF THE PREFERRED EMBODIMENTS

An analog/digital converter 1 according to a first embodiment of the present disclosure is explained below by referring to accompanying diagrams. The following description explains a typical analog/digital converter 1 of a four-bit sub-ranging type. Such an analog/digital converter 1 converts an analog signal into two highest-order bits of a digital signal prior to conversion of the analog signal into two lowest-order bits of the digital signal. However, concrete implementations of this embodiment are not limited to such an analog/digital converter 1.

Figure 1:
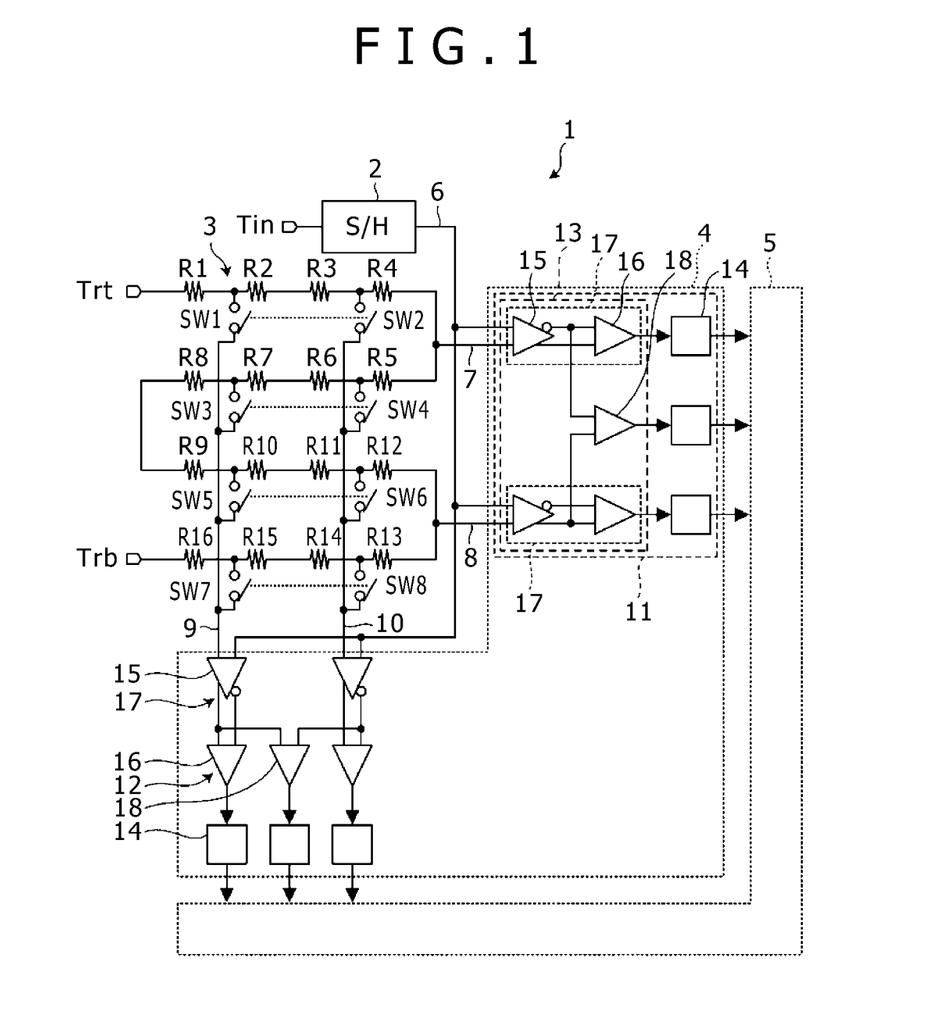
FIG. 1 is a diagram showing an analog/digital converter according to a first embodiment of the present disclosure.

As shown in FIG. 1, the analog/digital converter 1 includes a sample-hold section 2 for sampling and holding an analog signal, a reference-voltage generation section 3 for generating a plurality of reference voltages different from each other, a comparison section 4 for comparing the voltage of the analog signal with the reference voltages different from each other and a logic processing section 5 for carrying out logic processing on outputs of the comparison section 4 to generate a digital signal corresponding to the analog signal.

The sample-hold section 2 holds the voltage of the analog signal supplied to an input terminal Tin with a timing determined in advance for a time period also determined in advance, and outputs the voltage to the comparison section 4 through a hold signal line 6.

The reference-voltage generation section 3 has 16 resistors R1 to R16 which have the same resistance and are connected in series between a high-electric-potential-side reference power-supply terminal Trt and a low-electric-potential-side reference power-supply terminal Trb. The high-electric-potential-side reference power-supply terminal Trt is a terminal used for supplying a reference electric potential on the high electric-potential side whereas the low-electric-potential-side reference power-supply terminal Trb a terminal used for supplying a reference electric potential on the low electric-potential side. The reference-voltage generation section 3 serves as a potentiometer consisting of the 16 resistors R1 to R16 used for dividing voltage between the reference electric potential on the high electric-potential side and the reference electric potential on the low electric-potential side to generate a plurality of reference voltages determined in advance. The reference-voltage generation section 3 supplies the reference voltages determined in advance to the comparison section 4 through high-order-bit-side reference-voltage signal lines 7 and 8 and through low-order-bit-side reference-voltage signal lines 9 and 10.

Specifically, the high-order-bit-side reference-voltage signal line 7 is connected to a connection point between the fourth resistor R4 from the high-electric-potential-side reference power-supply terminal Trt and the fifth resistor R5 from the high-electric-potential-side reference power-supply terminal Trt in the reference-voltage generation section 3. On the other hand, the high-order-bit-side reference-voltage signal line 8 is connected to a connection point between the fourth resistor R13 from the low-electric-potential-side reference power-supply terminal Trb and the fifth resistor R12 from the low-electric-potential-side reference power-supply terminal Trb in the reference-voltage generation section 3.

The low-order-bit-side reference-voltage signal line 9 is connected to a connection point between the first resistor R1 from the high-electric-potential-side reference power-supply terminal Trt and the second resistor R2 from the high-electric-potential-side reference power-supply terminal Trt in the reference-voltage generation section 3 through a switch SW1. In addition, the low-order-bit-side reference-voltage signal line 9 is also connected to a connection point between the seventh resistor R7 from the high-electric-potential-side reference power-supply terminal Trt and the eighth resistor R8 from the high-electric-potential-side reference power-supply terminal Trt in the reference-voltage generation section 3 through a switch SW3. On top of that, the low-order-bit-side reference-voltage signal line 9 is also connected to a connection point between the ninth resistor R9 from the high-electric-potential-side reference power-supply terminal Trt and the tenth resistor R10 from the high-electric-potential-side reference power-supply terminal Trt in the reference-voltage generation section 3 through a switch SW5. Furthermore, the low-order-bit-side reference-voltage signal line 9 is also connected to a connection point between the 15th resistor R15 from the high-electric-potential-side reference power-supply terminal Trt and the 16th resistor R16 from the high-electric-potential-side reference power-supply terminal Trt in the reference-voltage generation section 3 through a switch SW7.

By the same token, the low-order-bit-side reference-voltage signal line 10 is connected to a connection point between the third resistor R3 from the high-electric-potential-side reference power-supply terminal Trt and the fourth resistor R4 from the high-electric-potential-side reference power-supply terminal Trt in the reference-voltage generation section 3 through a switch SW2. In addition, the low-order-bit-side reference-voltage signal line 10 is also connected to a connection point between the fifth resistor R5 from the high-electric-potential-side reference power-supply terminal Trt and the sixth resistor R6 from the high-electric-potential-side reference power-supply terminal Trt in the reference-voltage generation section 3 through a switch SW4. On top of that, the low-order-bit-side reference-voltage signal line 10 is also connected to a connection point between the 11th resistor R11 from the high-electric-potential-side reference power-supply terminal Trt and the 12th resistor R12 from the high-electric-potential-side reference power-supply terminal Trt in the reference-voltage generation section 3 through a switch SW6. Furthermore, the low-order-bit-side reference-voltage signal line 10 is also connected to a connection point between the 13th resistor R13 from the high-electric-potential-side reference power-supply terminal Trt and the 14th resistor R14 from the high-electric-potential-side reference power-supply terminal Trt in the reference-voltage generation section 3 through a switch SW8.

In an operation to convert the analog signal into a digital signal on the high-order bit side, the reference-voltage generation section 3 opens each of the switches SW1 to SW8 and sustains each of the switches SW1 to SW8 in a turned-off state to output the reference voltages for the high-order bit side to the comparison section 4 through the high-order-bit-side reference-voltage signal lines 7 and 8. In an operation to convert the analog signal into a digital signal on the low-order bit side, on the other hand, the reference-voltage generation section 3 closes each of the switches SW1 to SW8 and sustains each of the switches SW1 to SW8 in a turned-on state to output the reference voltages for the high-order bit side to the comparison section 4 through the low-order-bit-side reference-voltage signal lines 9 and 10.

The comparison section 4 has a high-order-bit-side comparison section 11 for comparing the voltage of the analog signal with the reference voltages for the high-order bit side and a low-order-bit-side comparison section 12 for comparing the voltage of the analog signal with the reference voltages for the low-order bit side. Since the high-order-bit-side comparison section 11 and the low-order-bit-side comparison section 12 have configurations identical with each other, only the configuration of the high-order-bit-side comparison section 11 is explained. That is, the configuration of the low-order-bit-side comparison section 12 is not described.

The high-order-bit-side comparison section 11 has an amplification section 13 for amplifying differences between the voltage of the analog signal and the reference voltages, and a compare-hold unit 14 for comparing and holding signals output by the amplification section 13.

The amplification section 13 includes two two-stage amplifiers 17 each having two differential amplification units 15 and 16 connected to each other in series. One of the two-stage amplifiers 17 amplifies the difference between the reference voltage received from the high-order-bit-side reference-voltage signal line 7 and the voltage of the analog signal, outputting the amplified signal to one of the compare-hold unit 14. On the other hand, the other two-stage amplifier 17 amplifies the difference between the reference voltage received from the high-order-bit-side reference-voltage signal line 8 and the voltage of the analog signal, outputting the amplified signal to another one of the compare-hold unit 14.

The amplification section 13 also has an interpolation amplification unit 18 for amplifying signals output by the differential amplifiers 15 employed in the two two-stage amplifiers 17.

It is to be noted that, in place of the two-stage amplifier 17, it is also possible to make use of an n-stage amplifier having n differential amplifiers connected to each other in series where n is an integer equal to or greater than 3.

Figure 2:
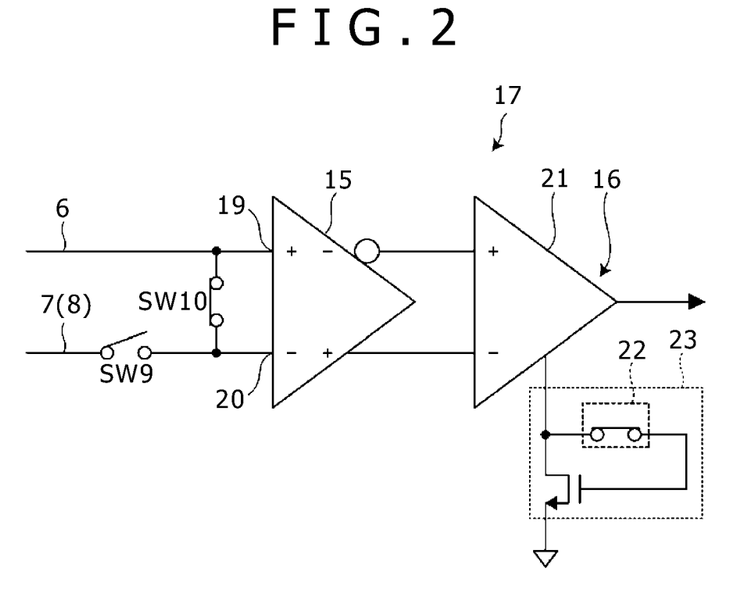
FIG. 2 is a diagram showing a model representing an amplifier operating in a reset mode.
Figure 3:
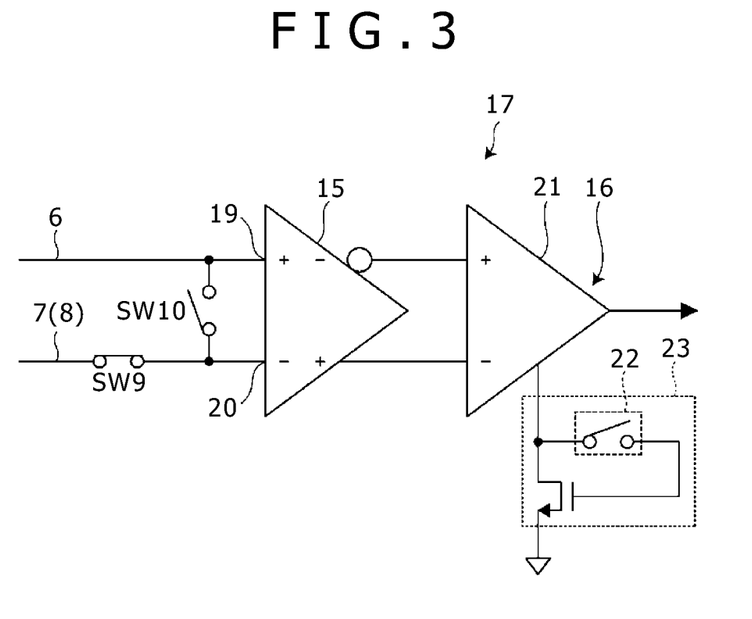
FIG. 3 is a diagram showing a model representing the amplifier operating in a comparison mode.

As shown in FIGS. 2 and 3, the two-stage amplifier 17 has the fixed-gain front-stage differential amplification unit 15 provided at the front stage, and the variable-gain rear-stage differential amplification unit 16 provided at the rear stage and connected to the front-stage differential amplification unit 15 in series.

A non-inverting input terminal 19 of the front-stage differential amplification unit 15 is connected to the hold signal line 6. On the other hand, an inverting input terminal 20 of the front-stage differential amplification unit 15 is connected to the high-order-bit-side reference-voltage signal line 7 or 8 through a switch SW9. The hold signal line 6 and the high-order-bit-side reference-voltage signal line 7 or 8 are connected to each other by the switch SW10. As shown in FIGS. 2 and 3, the switches SW9 and SW10 are closed and opened in a complementary manner on the basis of a clock (CLK) signal generated by a clock generation circuit not shown in the figures. That is, when the switch SW9 is sustained in an opened state, the switch SW10 is sustained in a closed state and when the switch SW9 is sustained in a closed state, on the other hand, the switch SW10 is sustained in an opened state.

The rear-stage differential amplification unit 16 has an amplification part 21 and a load circuit 23 including a changeover switch 22. The changeover switch 22 is operated to turn on or off to change the impedance of the load circuit 23. By changing the impedance of the load circuit 23 included in the rear-stage differential amplification unit 16, the gain of the rear-stage differential amplification unit 16 can be increased or decreased.

The two-stage amplifier 17 has an offset reduction function of increasing and decreasing the gain of the rear-stage differential amplification unit 16 by making use of the changeover switch 22 as described above to cause the offset voltage of the front-stage differential amplification unit 15 to appear to be decreased.

Next, the concrete structure of the two-stage amplifier 17 is explained by referring to FIG. 4 as follows.

As shown in the figure, the front-stage differential amplification unit 15 has first-conduction transistors T11 and T12 forming a pair. In this embodiment, a first-conduction transistor implies an N-channel transistor whereas a second-conduction transistor implies a P-channel transistor. However, a first-conduction transistor can also be a P-channel transistor whereas a second-conduction transistor can also be an N-channel transistor.

The gate electrode of the transistor T11 is connected to the non-inverting input terminal 19 cited above whereas the drain electrode of the transistor T11 is connected to a first power-supply terminal Vcc through a current source I1. On the other hand, the source electrode of the transistor T11 is connected to a second power-supply terminal GND (the ground) through a current source I3.

By the same token, the gate electrode of the transistor T12 is connected to the inverting input terminal 20 mentioned before whereas the drain electrode of the transistor T12 is connected to the first power-supply terminal Vcc through a current source I2. On the other hand, the source electrode of the transistor T12 is connected to the second power-supply terminal GND through the current source I3.

The front-stage differential amplification unit 15 also has a pair of P-channel transistors T21 and T22 as well as an amplification limiting part 24 for limiting signals output by the front-stage differential amplification unit 15.

The source electrode of the transistor T21 is connected to the drain electrode of the transistor T11. The gate electrode of the transistor T21 receives a bias voltage Vb1 determined in advance. A normal-phase output signal of the front-stage differential amplification unit 15 is output from the drain electrode of the transistor T21 to the rear-stage differential amplification unit 16.

By the same token, the source electrode of the transistor T22 is connected to the drain electrode of the transistor T12. The gate electrode of the transistor T22 receives the bias voltage Vb1 determined in advance. A reverse-phase output signal of the front-stage differential amplification unit 15 is output from the drain electrode of the transistor T22 to the rear-stage differential amplification unit 16.

The amplification limiting part 24 includes load resistors R21 and R22 as well as a resistor R30. One end of the load resistor R21 is connected to the drain electrode of the transistor T21 whereas one end of the load resistor R22 is connected to the drain electrode of the transistor T22. One end of the resistor R30 is connected to the other ends of the load resistors R21 and R22 whereas the other end of the resistor R30 is connected to the ground. The load resistors R21 and R22 limit the amplitudes of signals output by the front-stage differential amplification unit 15. The signals output by the front-stage differential amplification unit 15 are the normal-phase output signal and the reverse-phase output signal which have been mentioned above. The resistor R30 is a resistor used for adjusting the DC (direct current) operating points of the signals supplied to the rear-stage differential amplification unit 16, that is, the DC operating points of the signals output by the front-stage differential amplification unit 15, to proper voltages.

Next, the rear-stage differential amplification unit 16 is explained by referring to FIG. 4 as follows.

The rear-stage differential amplification unit 16 has a normal-phase input terminal 27 for receiving a normal-phase input signal which is the normal-phase signal output by the front-stage differential amplification unit 15. In addition, the rear-stage differential amplification unit 16 also has a reverse-phase input terminal 28 for receiving a reverse-phase input signal which is the reverse-phase signal output by the front-stage differential amplification unit 15. On top of that, the rear-stage differential amplification unit 16 also has a normal-phase output terminal 26 and a reverse-phase output terminal 25. The normal-phase output terminal 26 is used for outputting a normal-phase output signal obtained as a result of amplifying the reverse-phase input signal received by the reverse-phase input terminal 28. On the other hand, the reverse-phase output terminal 25 is used for outputting a reverse-phase output signal obtained as a result of amplifying the normal-phase input signal received by the normal-phase input terminal 27. Furthermore, the rear-stage differential amplification unit 16 also has an amplification part 21, a load circuit 23 and a leak cancel switch 30. The amplification part 21 is a part for amplifying the differential input signals to generate the output signals. The load circuit 23 is connected between the amplification part 21 and the ground, and has P-channel transistors T34 and T35. The leak cancel switch 30 is a switch for generating leak cancel currents used for reducing off leak currents flowing through the changeover switch 22 employed in the load circuit 23.

The amplification part 21 employs 3 N-channel transistors T31 to T33.

The drain electrode of the transistor T31 is connected to the first power-supply terminal Vcc whereas the gate electrode of the transistor T31 receives a bias voltage determined in advance. The transistor T31 functions as a current source.

The gate electrode of the transistor T32 is connected to the normal-phase input terminal 27 for receiving the normal-phase input signal whereas the drain electrode of the transistor T32 is connected to the source electrode of the transistor T31. On the other hand, the source electrode of the transistor T32 is connected to the reverse-phase output terminal 25. The transistor T32 operates as a first amplification portion for amplifying the normal-phase input signal received through the gate electrode of the transistor T32 to generate a reverse-phase output signal and for outputting the reverse-phase output signal from the source electrode of the transistor T32 to the reverse-phase output terminal 25.

By the same token, the gate electrode of the transistor T33 is connected to the reverse-phase input terminal 28 for receiving the reverse-phase input signal whereas the drain electrode of the transistor T33 is connected to the source electrode of the transistor T31. On the other hand, the source electrode of the transistor T33 is connected to the normal-phase output terminal 26. The transistor T33 operates as a second amplification portion for amplifying the reverse-phase input signal received through the gate electrode of the transistor T33 to generate a normal-phase output signal and for outputting the normal-phase output signal from the source electrode of the transistor T33 to the normal-phase output terminal 26.

It is to be noted that a capacitor can be provided between the gate electrode of the transistor T32 and the drain electrode of the transistor T21 to serve as a capacitor used for a capacitance-cut operation. By the same token, a capacitor can be provided between the gate electrode of the transistor T33 and the drain electrode of the transistor T22 also to serve as a capacitor for such a purpose. In such a case, a voltage to be a predetermined DC operating point is supplied to the gate electrodes of the transistors T32 and T33.

The load circuit 23 employs the P-channel transistors T34 and T35, capacitive elements C1 and C2 as well as P-channel transistors T36 and T37. The P-channel transistors T36 and T37 function as the changeover switch 22 cited above.

The transistor T34 is connected between the transistor T32 and the ground. The drain electrode of the transistor T34 is connected to the source electrode of the transistor T32. The gate electrode of the transistor T34 is connected to the drain electrode of the transistor T34 through the transistor T36 and is connected to the normal-phase output terminal 26 through the capacitive element C1.

One terminal of the capacitive element C1 is connected to the gate electrode of the transistor T34 whereas the other terminal of the capacitive element C1 is connected to the normal-phase output terminal 26.

One electrode of the transistor T36 operating as a portion of the changeover switch 22 is connected to the drain electrode of the transistor T34 whereas another electrode of the transistor T36 is connected to the gate electrode of the transistor T34. The transistor T36 connects the gate and drain electrodes of the transistor T34 to each other or disconnects the gate and drain electrodes of the transistor T34 from each other in accordance with a control signal supplied to the gate electrode of the transistor T36.

By the same token, the transistor T35 is connected between the transistor T33 and the ground. The drain electrode of the transistor T35 is connected to the source electrode of the transistor T33. The gate electrode of the transistor T35 is connected to the drain electrode of the transistor T35 through the transistor T37 and is connected to the reverse-phase output terminal 25 through the capacitive element C2.

One terminal of the capacitive element C2 is connected to the gate electrode of the transistor T35 whereas the other terminal of the capacitive element C2 is connected to the reverse-phase output terminal 25.

By the same token, one electrode of the transistor T37 operating as a portion of the changeover switch 22 is connected to the drain electrode of the transistor T35 whereas another electrode of the transistor T37 is connected to the gate electrode of the transistor T35. The transistor T37 connects the gate and drain electrodes of the transistor T35 to each other or disconnects the gate and drain electrodes of the transistor T35 from each other in accordance with a control signal supplied to the gate electrode of the transistor T37.

When the transistor T36 is closed and sustained in a turned-on state to connect the gate and drain electrodes of the transistor T34 to each other, the transistor T34 is put in a diode-connection state to operate as a load circuit included in the amplification part 21. By the same token, when the transistor T37 is closed and sustained in a turned-on state to connect the gate and drain electrodes of the transistor T35 to each other, the transistor T35 is put in a diode-connection state to operate as a load circuit included in the amplification part 21. Thus, the output impedance of the rear-stage differential amplification unit 16 decreases so that the gain of the rear-stage differential amplification unit 16 also decreases as well.

When the transistor T36 is opened and sustained in a turned-off state to disconnect the gate and drain electrodes of the transistor T34 from each other, on the other hand, the normal-phase output signal is supplied to the gate electrode of the transistor T34 from the normal-phase output terminal 26 through the capacitive element C1. By the same token, when the transistor T37 is opened and sustained in a turned-off state to disconnect the gate and drain electrodes of the transistor T35 from each other, on the other hand, the reverse-phase output signal is supplied to the gate electrode of the transistor T35 from the reverse-phase output terminal 25 through the capacitive element C2. Thus, the normal-phase output signal is fed back to the gate electrode of the transistor T34 in a positive feedback operation whereas the reverse-phase output signal is fed back to the gate electrode of the transistor T35 in a positive feedback operation. As a result, the gain of the rear-stage differential amplification unit 16 is increased.

As described above, the P-channel transistor T36 is used as a portion of the changeover switch 22. It is to be noted, however, that in place of the P-channel transistor T36, an N-channel transistor or a MOS switch can also be used to switch a connection between the drain electrode of the transistor T34 and the gate electrode of the transistor T34 to a connection between the normal-phase output terminal 26 and the gate electrode of the transistor T34 through the capacitive element C1 or vice versa.

By the same token, the P-channel transistor T37 is used as a portion of the changeover switch 22. It is to be noted, however, that in place of the P-channel transistor T37, an N-channel transistor or a MOS switch can also be used to switch a connection between the drain electrode of the transistor T35 and the gate electrode of the transistor T35 to a connection between the reverse-phase output terminal 25 and the gate electrode of the transistor T35 through the capacitive element C2 or vice versa.

The leak cancel switch 30 employs P-channel transistors T38 and T39.

The source electrode of the transistor T38 is connected to one terminal of the capacitive element C1 whereas the drain electrode of the transistor T38 is connected to the other terminal of the capacitive element C1. The gate electrode of the transistor T38 is connected to the ground so that the transistor T38 is always opened and sustained in a turned-off state. An off leak current flows through the transistor T38 as easily as or more easily than an off leak current flowing through the transistor T36 operating as a portion of the changeover switch 22. This is because, typically, the gate length of the transistor T38 is made smaller than that of the transistor T36 and the gate width of the transistor T38 is made greater than that of the transistor T36. That is, by making the gate length of the transistor T38 smaller than that of the transistor T36 and making the gate width of the transistor T38 greater than that of the transistor T36, the off leak current flowing through the transistor T38 can be made greater than the off leak current flowing through the transistor T36.

By the same token, the source electrode of the transistor T39 is connected to one terminal of the capacitive element C2 whereas the drain electrode of the transistor T39 is connected to the other terminal of the capacitive element C2. The gate electrode of the transistor T39 is connected to the ground so that the transistor T39 is always opened and sustained in a turned-off state. An off leak current flows through the transistor T39 as easily as or more easily than an off leak current flowing through the transistor T37 operating as a portion of the changeover switch 22. This is because, typically, the gate length of the transistor T39 is made smaller than that of the transistor T37 and the gate width of the transistor T39 is made greater than that of the transistor T37. That is, by making the gate length of the transistor T39 smaller than that of the transistor T37 and making the gate width of the transistor T39 greater than that of the transistor T37, the off leak current flowing through the transistor T39 can be made greater than the off leak current flowing through the transistor T37.

Figure 5:
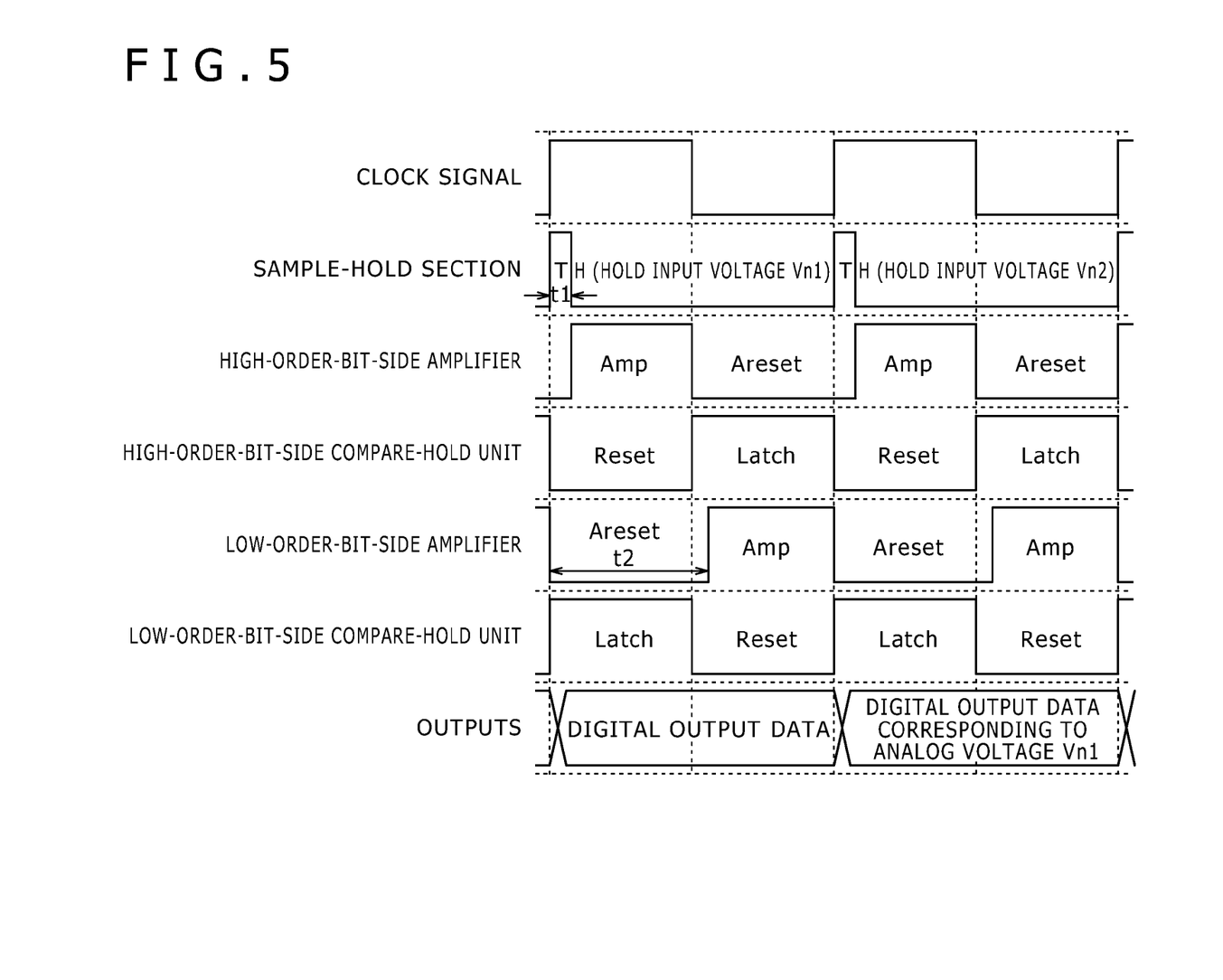
FIG. 5 shows timing charts of operations carried out by the analog/digital converter.

Next, operations carried out by the analog/digital converter 1 according to this embodiment are explained by referring to FIG. 5 which shows timing charts of the operations. The timing charts arranged in the downward direction starting with the timing chart at the top of FIG. 5 are respectively a timing chart of a clock (CLK) signal, a timing chart of operation timings of the sample-hold section 2, a timing chart of operation timings of the two-stage amplifier 17 on the high-order bit side, a timing chart of operation timings of the compare-hold unit 14 on the high-order bit side, a timing chart of operation timings of the two-stage amplifier 17 on the low-order bit side and a timing chart of operation timings of the compare-hold unit 14 on the low-order bit side.

It is to be noted that the two-stage amplifier 17 on the high-order bit side and the compare-hold unit 14 on the high-order bit side are respectively the two-stage amplifier 17 and the compare-hold unit 14 which are employed in the high-order-bit-side comparison section 11. On the other hand, the two-stage amplifier 17 on the low-order bit side and the compare-hold unit 14 on the low-order bit side are respectively the two-stage amplifier 17 and the compare-hold unit 14 which are employed in the low-order-bit-side comparison section 12.

The sample-hold section 2 tracks (or samples) the analog signal during a predetermined time period T synchronized to the rising edge of the clock signal. Then, the sample-hold section 2 holds the sampled analog signal during the following predetermined time period H ending on the next rising edge of the clock signal. In the typical example shown in FIG. 5, first of all, a voltage Vn1 of the input analog signal is sampled and held synchronously with at the first clock pulse. Then, a voltage Vn2 of the input analog signal is sampled and held synchronously with the second clock pulse.

The two-stage amplifier 17 on the high-order bit side operates in a comparison mode during a time period Amp between the end of a predetermined time period t1 starting on a rising edge of the clock signal and the next falling edge of the clock signal. In the comparison mode, the two-stage amplifier 17 on the high-order bit side amplifies the difference between the analog-signal voltage held by the sample-hold section 2 and a reference voltage.

During a time period Areset between a falling edge of the clock signal and the end of the predetermined time period t1 starting on the next rising edge of the clock signal, the two-stage amplifier 17 on the high-order bit side operates in a reset mode. The operations of the two-stage amplifier 17 on the high-order bit side will be explained later in detail.

The compare-hold unit 14 on the high-order bit side is reset synchronously with the rising edge of the clock signal and latches the output signal of the two-stage amplifier 17 on the high-order bit side synchronously with the falling edge of the clock signal. That is, the compare-hold unit 14 on the high-order bit side is in a reset state while the clock signal is put in a time period of a high level, and latches the output signal of the two-stage amplifier 17 on the high-order bit side while the clock signal is put in a time period of a low level.

The logic processing section 5 shown in FIG. 1 carries out logic processing on the signal, which has been output by the two-stage amplifier 17 on the high-order bit side and held in the compare-hold unit 14 on the high-order bit side, to generate a digital signal on the high-order bit side. On the other hand, the reference-voltage generation section 3 generates a reference voltage on the low-order bit side.

The reader is requested to refer back to FIG. 5.

The two-stage amplifier 17 on the low-order bit side operates in a comparison mode during a time period Amp between the end of a predetermined time period t2 starting on a falling edge of the clock signal and the next rising edge of the clock signal. In the comparison mode, the two-stage amplifier 17 on the low-order bit side amplifies the difference between the analog-signal voltage held by the sample-hold section 2 and the reference voltage cited above. During a time period Areset between a rising edge of the clock signal and the end of the predetermined time period t2 starting on the next falling edge of the clock signal, the two-stage amplifier 17 on the low-order bit side operates in a reset mode. The operations of the two-stage amplifier 17 on the low-order bit side will be explained later in detail.

The compare-hold unit 14 on the low-order bit side is reset synchronously with the falling edge of the clock signal and latches the output signal of the two-stage amplifier 17 on the low-order bit side synchronously with the rising edge of the clock signal. That is, the compare-hold unit 14 on the low-order bit side is in a reset state while the clock signal is put in a time period of a low level and latches the output signal of the two-stage amplifier 17 on the high-order bit side while the clock signal is put in a time period of a high level.

The logic processing section 5 shown in FIG. 1 carries out logic processing on the signal, which has been output by the two-stage amplifier 17 on the low-order bit side and held in the compare-hold unit 14 on the low-order bit side, to generate a digital signal on the low-order bit side.

The reader is requested to refer back to FIG. 5.

The logic processing section 5 outputs the digital signal generated on the high-order bit side and the digital signal generated on the low-order bit side. Thus, as shown in FIG. 5, a digital signal generated for an analog signal is output after one clock period has elapsed since the analog signal was tracked by the sample-hold section 2.

Next, operations carried out by the two-stage amplifier 17 on the high-order bit side are explained as follows. It is to be noted that operations carried out by the two-stage amplifier 17 on the low-order bit side are identical with the operations carried out by the two-stage amplifier 17 on the high-order bit side except the timings as shown in FIG. 5. For this reason, the operations carried out by the two-stage amplifier 17 on the low-order bit side are not explained.

As described above, the switches SW9 and SW10 employed in the two-stage amplifier 17 are closed (or put in a turned-on state) and opened (or put in a tuned-off state) in a complementary manner on the basis of a clock (CLK) signal generated by a clock generation circuit. That is, when the switch SW9 is opened, the switch SW10 is closed and when the switch SW9 is closed, on the other hand, the switch SW10 is opened.

During a time period between a falling edge of the clock signal and the end of the predetermined time period t1 starting on the next rising edge of the clock signal, as shown in FIG. 2, the switch SW9 is put in a turned-off state but the switch SW10 is put in a turned-on state. Thus, the non-inverting input terminal 19 of the front-stage differential amplification unit 15 is connected to the inverting input terminal 20 of the front-stage differential amplification unit 15 and the voltage of the analog signal is supplied to both the non-inverting input terminal 19 and the inverting input terminal 20. When the switch SW9 is sustained in a turned-off state but the switch SW10 is sustained in a turned-on state, the two-stage amplifier 17 operates in a reset mode.

During a time period between the end of the predetermined time period t1 starting on a rising edge of the clock signal and the next falling edge of the clock signal, as shown in FIG. 3, the switch SW9 is put in a turned-on state but the switch SW10 is put in a turned-off state. Thus, the non-inverting input terminal 19 of the front-stage differential amplification unit 15 receives the voltage of the analog signal whereas the inverting input terminal 20 of the front-stage differential amplification unit 15 receives a reference voltage. When the switch SW9 is sustained in a turned-on state but the switch SW10 is sustained in a turned-off state, the two-stage amplifier 17 operates in a comparison mode.

The changeover switch 22 is closed (or put in a turned-on state) and opened (or put in a turned-off state) alternately in accordance with the clock signal. To put it concretely, during a time period between a falling edge of the clock signal and the end of the predetermined time period t1 starting on the next rising edge of the clock signal, the changeover switch 22 is put in a turned-on state and the two-stage amplifier 17 operates in a reset mode. During a time period between the end of the predetermined time period t1 starting on a rising edge of the clock signal and the next falling edge of the clock signal, the changeover switch 22 is put in a turned-off state and the two-stage amplifier 17 operates in a comparison mode.

Figure 4:
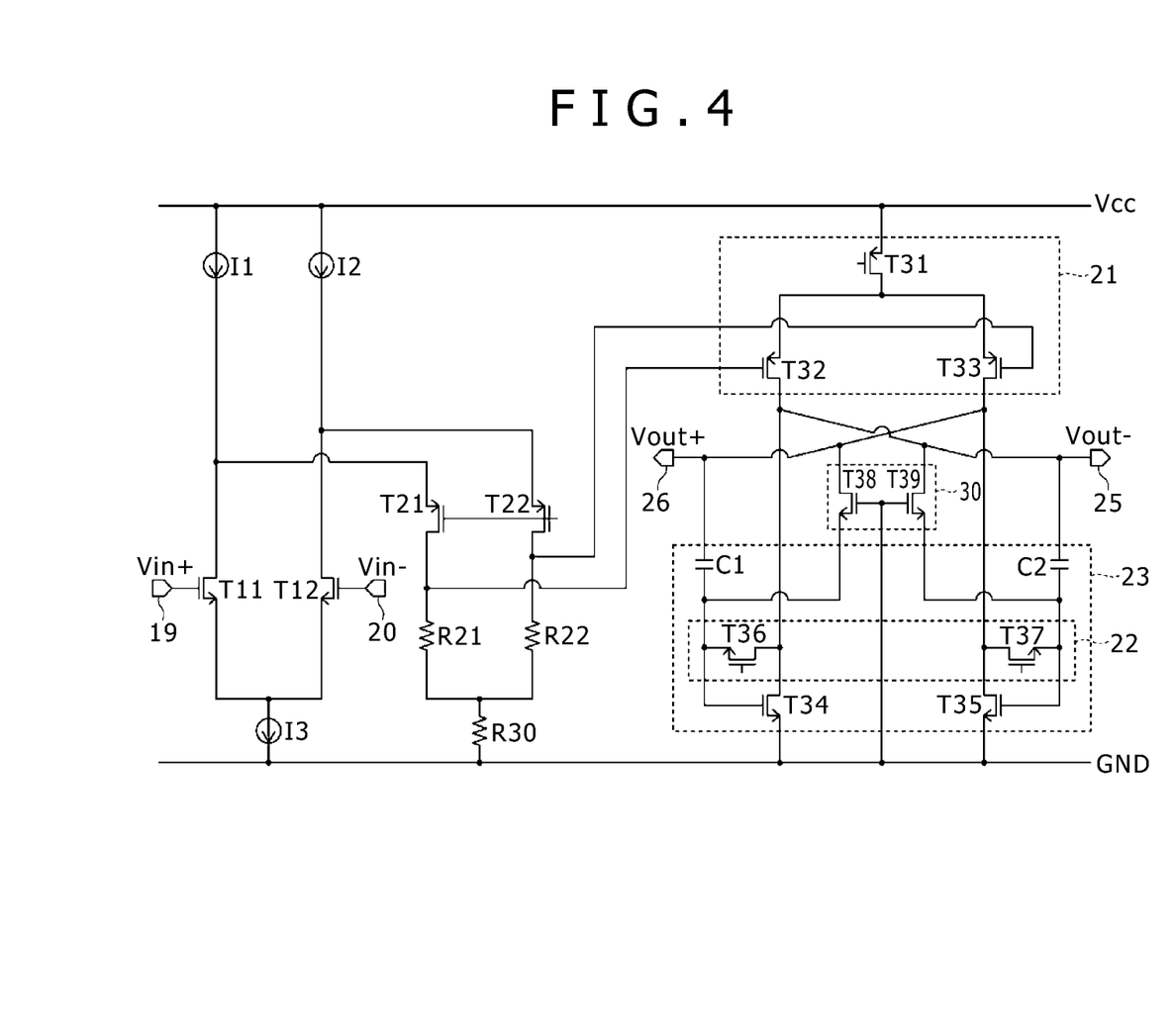
FIG. 4 is a diagram showing the circuit of the amplifier.

When the two-stage amplifier 17 is operating in a reset mode, the changeover switch 22 shown in FIG. 4 is put in a turned-on state and the load circuit 23 employed in the rear-stage differential amplification unit 16 provided at the rear stage becomes a load circuit put in a diode-connection state. Thus, the gain of the rear-stage differential amplification unit 16 in the reset mode is reduced.

When the two-stage amplifier 17 is operating in a comparison mode, on the other hand, the changeover switch 22 shown in FIG. 4 is put in a turned-off state and the load circuit 23 employed in the rear-stage differential amplification unit 16 provided at the rear stage becomes a current-source load circuit. In addition, since the changeover switch 22 is put in a turned-off state, the gate electrode of the transistor T34 is connected to the normal-phase output terminal 26 through the capacitive element C1 whereas the gate electrode of the transistor T35 is connected to the reverse-phase output terminal 25 through the capacitive element C2. Thus, the normal-phase output signal is fed back to the gate electrode of the transistor T34 in a positive feedback operation whereas the reverse-phase output signal is fed back to the gate electrode of the transistor T35 in a positive feedback operation. As a result, the gain of the rear-stage differential amplification unit 16 in the comparison mode is further increased.

As is obvious from the above descriptions, the gain of the rear-stage differential amplification unit 16 in the comparison mode is greater than the gain of the rear-stage differential amplification unit 16 in the reset mode. Thus, the two-stage amplifier 17 causes the offset voltage of the front-stage differential amplification unit 15 provided at the front stage to appear to be reduced.

The following description explains the fact that the offset voltage of the front-stage differential amplification unit 15 provided at the front stage appears to be reduced. Let notation Vos denote the offset voltage of the front-stage differential amplification unit 15 provided at the front stage, notation Gr denote the gain of the two-stage amplifier 17 operating in the reset mode, notation Gc denote the gain of the two-stage amplifier 17 operating in the comparison mode where Gr>Gc, notation Vin denote the input voltage received in the comparison mode whereas notation Vout denote the output voltage. In this case, the output voltage Vout generated in the reset mode is expressed as follows:

$$V\text{out}=Gr \cdot V\text{os}$$

The output voltage Vout generated in the comparison mode is expressed as follows:

$$V\text{out}=Gc \cdot V\text{in}$$

Thus, the following equation is obtained:

$$Gr \cdot V\text{os}=Gc \cdot V\text{in}$$

As a result, the following equation can be derived:

$$V\text{in}=V\text{os} \cdot Gr/Gc$$

As described above, in the two-stage amplifier 17 which increases and decreases the gain of the rear-stage differential amplification unit 16 in accordance with the operating mode of the two-stage amplifier 17, the offset voltage is reduced by a factor of Gr/Gc times where Gr>Gc so that an input-converted offset is represented by the expression Vos·Gr/Gc.

In particular, when the rear-stage differential amplification unit 16 according to the embodiment is operating in the comparison mode, the gate electrode of the transistor T34 is connected to the normal-phase output terminal 26 through the capacitive element C1 whereas the gate electrode of the transistor T35 is connected to the reverse-phase output terminal 25 through the capacitive element C2 to implement a positive-feedback loop. Thus, in comparison with the configuration in which the load circuit 23 merely functions as a current-source load, the gain can be increased by an increment A1. Accordingly, by putting the changeover switch 22 in a turned-off state, the two-stage amplifier 17 is capable of further reducing the offset voltage by the gain increment A1 in comparison with the configuration in which the load circuit 23 merely functions as a current-source load.

With the load circuit 23 of the rear-stage differential amplification unit 16 put in a positive-feedback loop in the comparison mode, however, the gain of the rear-stage differential amplification unit 16 may undesirably decrease in some cases due to an effect of an off leak current flowing through the changeover switch 22. The effect of an off leak current flowing through the changeover switch 22 is explained by referring to FIGS. 6A to 6D. FIGS. 6A to 6D are a plurality of explanatory diagrams referred to in the following description of operations carried out by a differential amplification circuit having a configuration obtained by eliminating the leak cancel switch 30 from the rear-stage differential amplification unit 16 shown in FIG. 4.

Figure 6A:
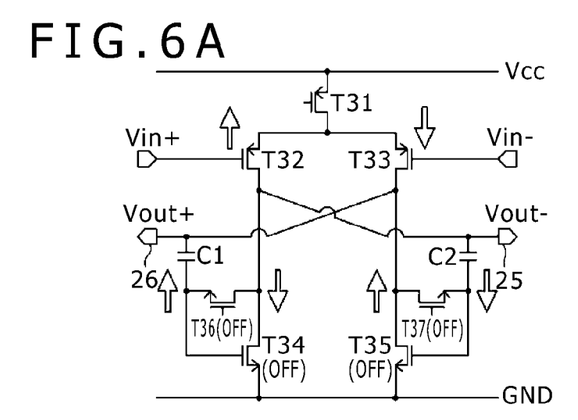
FIGS. 6A to 6D are a plurality of explanatory diagrams showing operations carried out by a differential amplification circuit.

As shown in FIG. 6A, in the comparison mode, the changeover switch 22 is sustained in a turned-off state. To put it concretely, no voltages are supplied to the gate electrodes of the transistors T36 and T37 which operate as the changeover switch 22. That is, each of the transistors T36 and T37 is put in a turned-off state.

When the normal-phase input signal is supplied to the normal-phase input terminal 27 to raise an electric potential appearing on the normal-phase input terminal 27, a reverse-phase output signal is fed back to the load circuit 23 in a positive-feedback operation, increasing an electric potential appearing between the capacitive element C1 and the gate electrode of the transistor T34. Thus, an electric potential appearing between the transistor T32 employed in the amplification part 21 and the transistor T34 employed in the load circuit 23 decreases.

By the same token, when the reverse-phase input signal is supplied to the reverse-phase input terminal 28 to lower an electric potential appearing on the reverse-phase input terminal 28, a normal-phase output signal is fed back to the load circuit 23 in a positive-feedback operation, decreasing an electric potential appearing between the capacitive element C2 and the gate electrode of the transistor T35. Thus, an electric potential appearing between the transistor T33 employed in the amplification part 21 and the transistor T35 employed in the load circuit 23 increases.

Figure 6B:
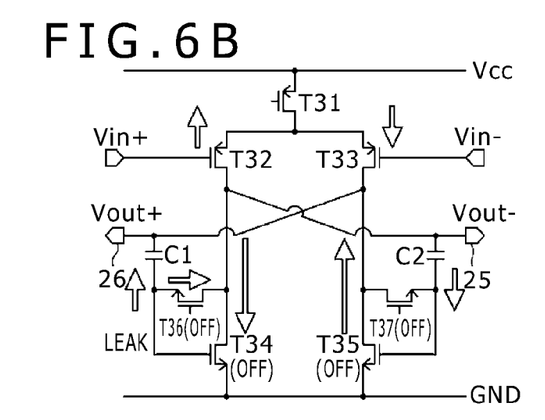

As shown in FIG. 6B, the gain increases due to the positive feedback operation with the lapse of time since the start of the comparison mode, raising the decrease of the electric potential appearing between the transistor T32 employed in the amplification part 21 and the transistor T34 employed in the load circuit 23. As the decrease of the electric potential appearing between the transistor T32 employed in the amplification part 21 and the transistor T34 employed in the load circuit 23 rises, the difference between the electric potentials appearing at the drain and source electrodes of the transistor T36 serving as a portion of the changeover switch 22 increases, undesirably generating an off leak current.

By the same token, the gain increases due to the positive feedback operation with the lapse of time since the start of the comparison mode, and raises the increase of the electric potential appearing between the transistor T33 employed in the amplification part 21 and the transistor T35 employed in the load circuit 23. As the increase of the electric potential appearing between the transistor T33 employed in the amplification part 21 and the transistor T35 employed in the load circuit 23 rises, the difference between the electric potentials appearing at the drain and source electrodes of the transistor T37 serving as a portion of the changeover switch 22 increases, undesirably generating an off leak current.

As shown in FIG. 6B, the off leak current flows to a specific electrode of the transistor T36 from another electrode of the transistor T36. The specific electrode of the transistor T36 is an electrode connected to the drain electrode of the transistor T34 whereas the other electrode of the transistor T36 is an electrode connected to the capacitive element C1. By the same token, the other off leak current flows from a specific electrode of the transistor T37 to another electrode of the transistor T37. The specific electrode of the transistor T37 is an electrode connected to the drain electrode of the transistor T35 whereas the other electrode of the transistor T37 is an electrode connected to the capacitive element C2.

Figure 6C:
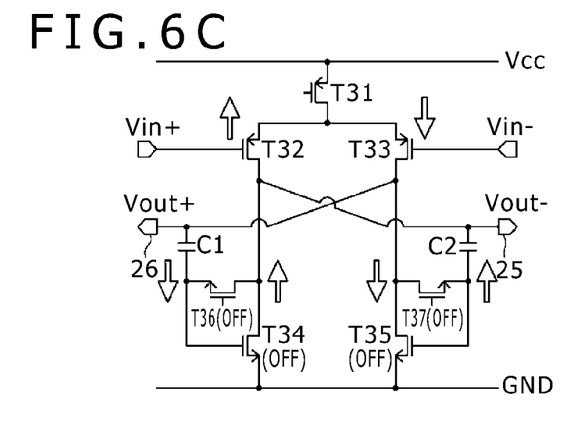

Thus, as shown in FIG. 6C, the electric potential appearing between the capacitive element C1 and the gate electrode of the transistor T34 decreases and the electric potential appearing between the transistor T32 employed in the amplification part 21 and the transistor T34 employed in the load circuit 23 rises. In addition, the electric potential appearing between the capacitive element C2 and the gate electrode of the transistor T35 increases and the electric potential appearing between the transistor T33 employed in the amplification part 21 and the transistor T35 employed in the load circuit 23 decreases. As a result, the gain of the rear-stage differential amplification unit 16 is inverted.

Figure 6D:
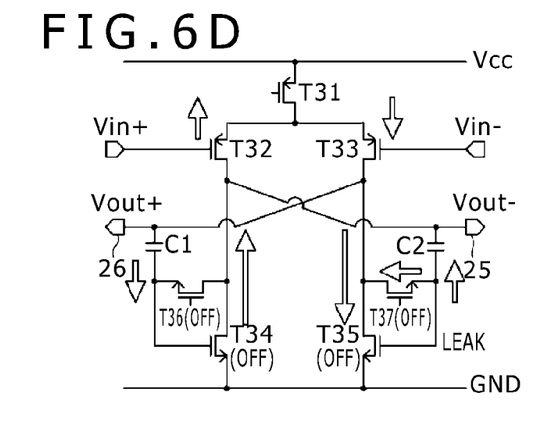

As shown in FIG. 6D, the rear-stage differential amplification unit 16 feeds back an output signal to the load circuit 23 in a positive-feedback operation. Thus, with the gain of the rear-stage differential amplification unit 16 inverted as it is, the gain further decreases with the lapse of time due to the positive-feedback operation. Accordingly, the increase of the electric potential appearing between the transistor T32 employed in the amplification part 21 and the transistor T34 employed in the load circuit 23 rises whereas a difference between the electric potentials appearing at the drain and source electrodes of the transistor T36 serving as a portion of the changeover switch 22 also increases as well, generating an off leak current unavoidably. This off leak current flows from a specific electrode of the transistor T36 to another electrode of the transistor T36. The specific electrode of the transistor T36 is an electrode connected to the drain electrode of the transistor T34 whereas the other electrode of the transistor T36 is an electrode connected to the capacitive element C1.

By the same token, the decrease of the electric potential appearing between the transistor T33 employed in the amplification part 21 and the transistor T35 employed in the load circuit 23 rises, and a difference between the electric potentials appearing at the drain and source electrodes of the transistor T37 serving as a portion of the changeover switch 22 also increases as well, generating an off leak current unavoidably. This other off leak current flows to a specific electrode of the transistor T37 from another electrode of the transistor T37. The specific electrode of the transistor T37 is an electrode connected to the drain electrode of the transistor T33 whereas the other electrode of the transistor T37 is an electrode connected to the capacitive element C2.

Due to the effect of the off leak current shown in FIG. 6D, an electric potential appearing between the capacitive element C1 and the gate electrode of the transistor T34 increases whereas an electric potential appearing between the transistor T32 employed in the amplification part 21 and the transistor T34 employed in the load circuit 23 decreases. By the same token, due to the effect of the other off leak current shown in FIG. 6D, an electric potential appearing between the capacitive element C2 and the gate electrode of the transistor T35 decreases whereas an electric potential appearing between the transistor T33 employed in the amplification part 21 and the transistor T35 employed in the load circuit 23 increases. Thus, the gain of the rear-stage differential amplification unit 16 is inverted, resulting in the state shown in FIG. 6A.

In this way, if the off leak currents flow to the changeover switch 22, an electric potential appearing between the two terminals of the changeover switch 22 increases and decreases repeatedly so that the gain of the rear-stage differential amplification unit 16 is inevitably inverted repeatedly.

In the case of a circuit in which an off leak current flows with ease to the changeover switch 22 due to a manufacturing process, the effect of the off leak current appears as a big effect so that, in comparison with the reset mode, the gain of the rear-stage differential amplification unit 16 operating in the comparison mode undesirably becomes unstable.

The gain inversion caused by an off leak current occurs not only in a circuit in which an off leak current flows with ease, but also in a configuration having a clock signal with a low frequency. A typical example of the configuration having a clock signal with a low frequency is a configuration having a clock signal with a frequency of 1 MHz. This is because, if the clock signal has a low frequency, the period of the comparison mode becomes longer so that an electric potential appearing between the amplification part 21 and the load circuit 23 increases due to a positive feedback operation. Thus, the off leak current also increases with ease.

In order to solve the problems described above, the rear-stage differential amplification unit 16 according to the embodiment is provided with the leak cancel switch 30 for reducing the effect of the off leak current. The leak cancel switch 30 generates a leak cancel current in a direction opposite to the direction of the off leak current. That is, the leak cancel switch 30 generates a leak cancel current in a direction in which the positive-feedback operation is sustained. Thus, the rear-stage differential amplification unit 16 is made capable of avoiding a gain inversion caused by an off leak current and preventing the operation thereof from becoming instable.

Figure 7:
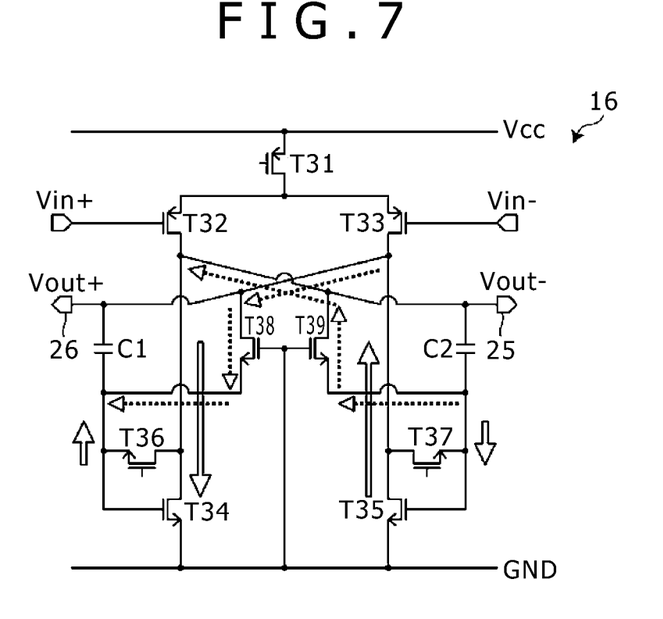
FIG. 7 is an explanatory diagram to be referred to in description of operations carried out by a differential amplification circuit.

As shown in FIG. 7, the leak cancel switch 30 employs transistors T38 and T39. The drain electrode of the transistor T38 is connected to the normal-phase output terminal 26 whereas the source electrode of the transistor T38 is connected to the gate electrode of the transistor T34. On the other hand, the drain electrode of the transistor T39 is connected to the reverse-phase output terminal 25 whereas the source electrode of the transistor T39 is connected to the gate electrode of the transistor T35. The gate electrodes of the transistors T38 and T39 are both connected to the ground to put the leak cancel switch 30 always in a turned-off state.

The following description explains operations carried out by the leak cancel switch 30 in the comparison mode. After the start of the comparison mode, as shown in FIG. 6B, the gain of the rear-stage differential amplification unit 16 increases with the lapse of time due to the positive-feedback operation. Thus, an electric potential appearing at the normal-phase output terminal 26 increases. The electric potential appearing at the normal-phase output terminal 26 is an electric potential appearing between the transistor T33 employed in the amplification part 21 and the transistor T35 employed in the load circuit 23. In addition, an electric potential appearing between the capacitive element C1 and the gate electrode of the transistor T34 also rises as well. However, the increase of the electric potential appearing at the normal-phase output terminal 26 is greater than the increase of the electric potential appearing between the capacitive element C1 and the gate electrode of the transistor T34. Thus, as shown in FIG. 7, an electric potential appearing at the drain electrode of the transistor T38 employed in the leak cancel switch 30 is higher than an electric potential appearing at the source electrode of the transistor T38. As a result, an off leak current of the transistor T38 flows from the drain electrode of the transistor T38 to the source electrode of the transistor T38.

As described above, the gain increase caused by the positive-feedback operation decreases an electric potential appearing between the transistor T32 employed in the amplification part 21 and the transistor T34 employed in the load circuit 23. Thus, an off leak current flows to a specific electrode of the transistor T36 employed in the changeover switch 22 from another electrode of the transistor T36. The specific electrode of the transistor T36 is an electrode connected to the drain electrode of the transistor T34 whereas the other electrode of the transistor T36 is an electrode connected to the capacitive element C1.

If the leak cancel switch 30 is not used, an electric potential appearing between the capacitive element C1 and the gate electrode of the transistor T34 decreases as shown in FIG. 6C. In the rear-stage differential amplification unit 16 according to the embodiment shown in FIG. 7, on the other hand, an off leak current flows from the transistor T38 employed in the leak cancel switch 30 to the other electrode of the transistor T36. As described above, the other electrode of the transistor T36 is an electrode connected to the capacitive element C1. It is thus possible to prevent the electric potential appearing between the capacitive element C1 and the gate electrode of the transistor T34 from decreasing so that the gain of the rear-stage differential amplification unit 16 is not inverted. In this way, the off leak current of the transistor T38 functions as a leak cancel current for cancelling the effect of the off leak current of the changeover switch 22.

By the same token, an electric potential appearing at the reverse-phase output terminal 25 decreases. The electric potential appearing at the reverse-phase output terminal 25 is an electric potential appearing between the transistor T32 employed in the amplification part 21 and the transistor T34 employed in the load circuit 23. In addition, an electric potential appearing between the capacitive element C2 and the gate electrode of the transistor T35 also decreases as well. However, the decrease of the electric potential appearing at the reverse-phase output terminal 25 is greater than the decrease of the electric potential appearing between the capacitive element C2 and the gate electrode of the transistor T35. Thus, as shown in FIG. 7, an electric potential appearing at the drain electrode of the transistor T39 employed in the leak cancel switch 30 is higher than an electric potential appearing at the source electrode of the transistor T39. As a result, an off leak current of the transistor T39 flows from the source electrode of the transistor T39 to the drain electrode of the transistor T39.

An off leak current flows from a specific electrode of the transistor T37 employed in the changeover switch 22 to another electrode of the transistor T37. The specific electrode of the transistor T37 is an electrode connected to the drain electrode of the transistor T35 whereas the other electrode of the transistor T37 is an electrode connected to the capacitive element C2. In addition, another off leak current of the transistor T39 employed in the leak cancel switch 30 flows from the transistor T39 to the other electrode of the transistor T37. As described above, the other electrode of the transistor T37 is an electrode connected to the capacitive element C2. Thus, it is possible to prevent an electric potential appearing between the capacitive element C2 and the gate electrode of the transistor T35 from rising. As a result, the gain of the rear-stage differential amplification unit 16 is not inverted. In this way, the off leak current of the transistor T39 functions as a leak cancel current for cancelling the effect of the off leak current of the changeover switch 22.

In order to eliminate the increase of an electric potential appearing between the capacitive element C1 and the gate electrode of the transistor T34 and the decrease of this electric potential, the magnitude of the leak cancel current flowing to the transistor T38 employed in the leak cancel switch 30 should be made equal to or greater than the magnitude of the off leak current flowing to the transistor T36 employed in the changeover switch 22. By the same token, in order to eliminate the increase of an electric potential appearing between the capacitive element C2 and the gate electrode of the transistor T35 and the decrease of this electric potential, the magnitude of the leak cancel current flowing to the transistor T39 employed in the leak cancel switch 30 should be made equal to or greater than the magnitude of the off leak current flowing to the transistor T37 employed in the changeover switch 22.

In order to make the magnitude of the leak cancel current flowing to the transistor T38 employed in the leak cancel switch 30 equal to or greater than the magnitude of the off leak current flowing to the transistor T36 employed in the changeover switch 22, it is realized to make the gate width of the transistor T38 equal to or greater than the gate width of the transistor T36 and make the gate length of the transistor T38 equal to or smaller than the gate length of the transistor T36. By the same token, in order to make the magnitude of the leak cancel current flowing to the transistor T39 employed in the leak cancel switch 30 equal to or greater than the magnitude of the off leak current flowing to the transistor T37 employed in the changeover switch 22, it is realized to make the gate width of the transistor T39 equal to or greater than the gate width of the transistor T37 and make the gate length of the transistor T39 equal to or smaller than the gate length of the transistor T37.

By letting the leak cancel current having a magnitude equal to or greater than the magnitude of the off leak current flowing through the changeover switch 22 flow through the leak cancel switch 30 in a direction in which the positive-feedback operation is sustained in the comparison mode as described above, it is possible to prevent the gain of the rear-stage differential amplification unit 16 from oscillating even for a case in which the circuit is manufactured by carrying out a manufacturing process causing an off leak current to be generated with ease and a case in which the analog/digital converter 1 operates at a low speed. In this way, the analog/digital converter 1 employing the rear-stage differential amplification unit 16 is made capable of getting rid of the effect of an off leak current flowing through the changeover switch 22 to eliminate the oscillation of the gain of the rear-stage differential amplification unit 16.

In the analog/digital converter 1 described above, the rear-stage differential amplification unit 16 shown in FIG. 7 is used as a rear-stage differential amplifier of the two-stage amplifier 17. It is to be noted, however, that rear-stage differential amplification units usable in the two-stage amplifier 17 are not limited to the rear-stage differential amplification unit 16 shown in FIG. 7. For example, any one of differential amplification units 16a to 16e shown in FIGS. 8 to 12 respectively can also be used as a rear-stage differential amplification unit of the two-stage amplifier 17. It is to be noted that, in FIGS. 8 to 12, every configuration component having a function identical with its counterpart employed in the rear-stage differential amplification unit 16 shown in FIG. 7 is denoted by the same reference symbol as the counterpart.

Figure 8:
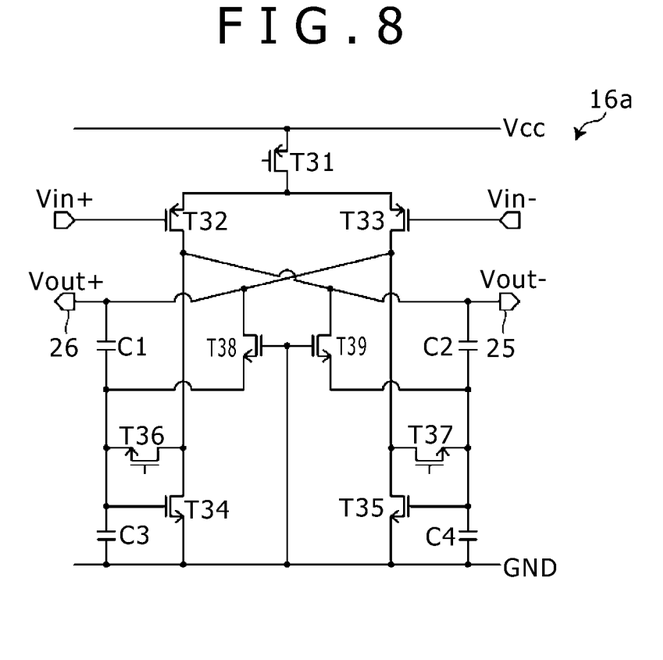
FIG. 8 is a diagram showing a differential amplification circuit.

The rear-stage differential amplification unit 16a shown in FIG. 8 employs capacitive elements C3 and C4. One terminal of the capacitive element C3 is connected to the gate electrode of the transistor T34 employed in the load circuit 23 whereas the other terminal of the capacitive element C3 is connected to the ground. By the same token, one terminal of the capacitive element C4 is connected to the gate electrode of the transistor T35 employed in the load circuit 23 whereas the other terminal of the capacitive element C4 is connected to the ground.

By connecting the capacitive elements C3 and C4 as described above, the operating point of the comparison mode can be made more stable.

Figure 9:
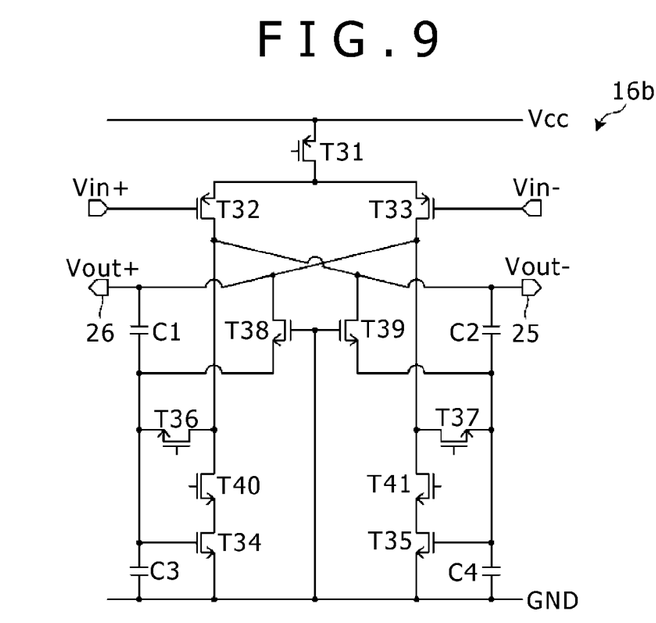
FIG. 9 is a diagram showing a differential amplification circuit.

The rear-stage differential amplification unit 16b shown in FIG. 9 employs transistors T40 and T41. The transistor T40 is connected to the transistor T34 in a cascade connection whereas the transistor T41 is connected to the transistor T35 in a cascade connection. A bias voltage determined in advance is applied to the gate electrodes of the transistors T40 and T41.

Figure 10:
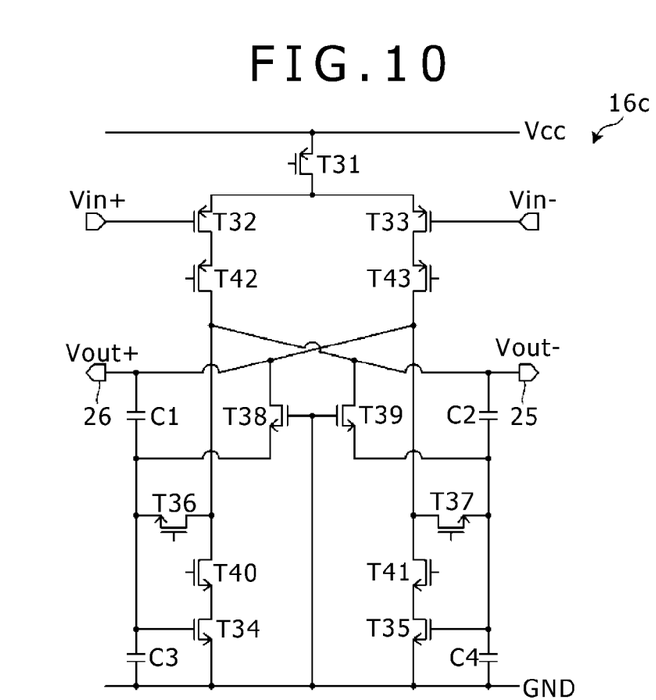
FIG. 10 is a diagram showing a differential amplification circuit.

The rear-stage differential amplification unit 16c shown in FIG. 10 employs transistors T42 and T43. The transistor T42 is connected to the transistor T32 in a cascade connection whereas the transistor T43 is connected to the transistor T33 in a cascade connection. A bias voltage determined in advance is applied to the gate electrodes of the transistors T42 and T43.

Figure 11:
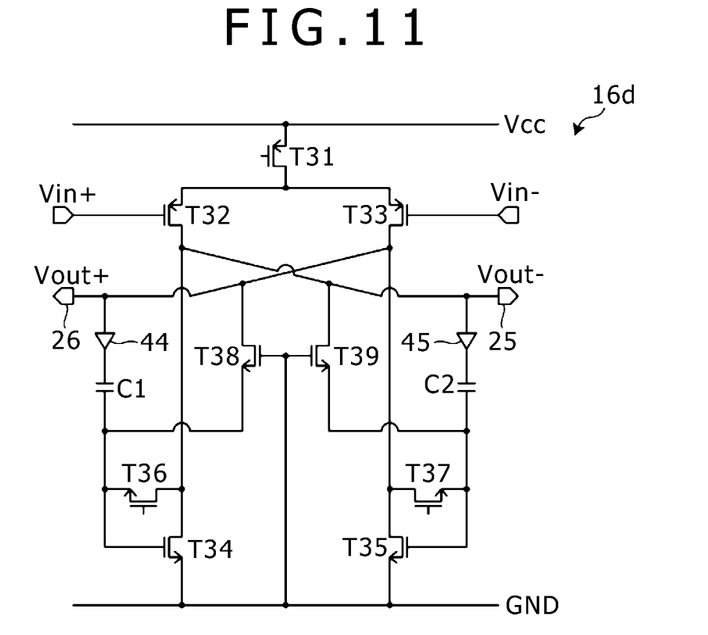
FIG. 11 is a diagram showing a differential amplification circuit.

The rear-stage differential amplification unit 16d shown in FIG. 11 employs amplification portions 44 and 45. Provided between the normal-phase output terminal 26 and the capacitive element C1, the amplification portion 44 amplifies the normal-phase output signal and supplies the amplified signal to the capacitive element C1. By the same token, the amplification portion 45 is provided between the reverse-phase output terminal 25 and the capacitive element C2 to serve as an amplifier for amplifying the reverse-phase output signal and supplying the amplified signal to the capacitive element C2. It is to be noted that, in place of the amplifiers 44 and 45, buffers can also be used. In addition, in the rear-stage differential amplification unit 16d shown in FIG. 11, one electrode of the transistor T38 employed in the leak cancel switch 30 is connected to the input terminal of the amplification portion 44. However, this electrode of the transistor T38 employed in the leak cancel switch 30 can also be connected to the output terminal of the amplification portion 44. In this case, the transistor T38 is connected to the amplification portion 44 in parallel to the capacitive element C1. By the same token, in the rear-stage differential amplification unit 16d shown in FIG. 11, one electrode of the transistor T39 employed in the leak cancel switch 30 is connected to the input terminal of the amplification portion 45. However, this electrode of the transistor T39 employed in the leak cancel switch 30 can also be connected to the output terminal of the amplification portion 45. In this case, the transistor T39 is connected to the amplification portion 45 in parallel to the capacitive element C2.

Figure 12:
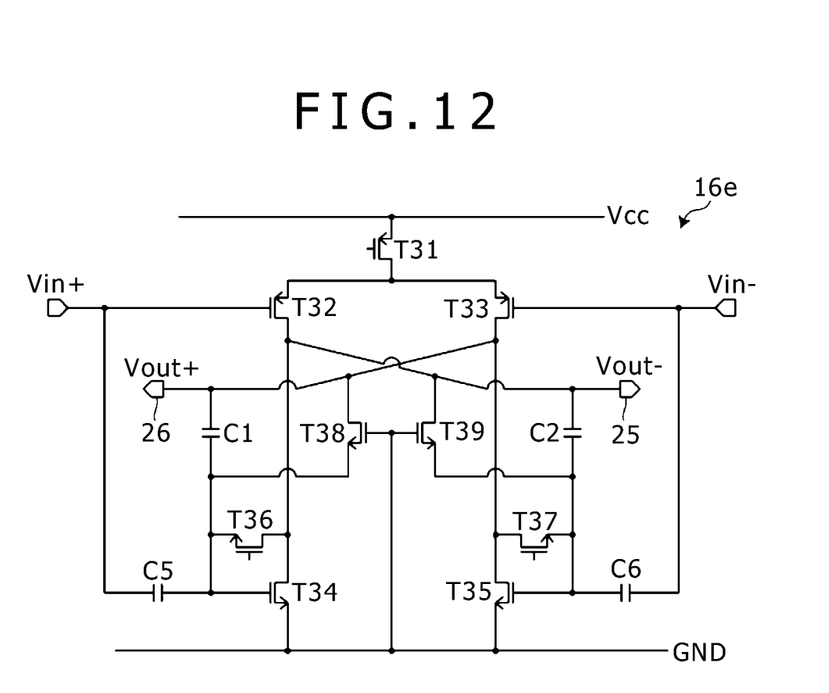
FIG. 12 is a diagram showing a differential amplification circuit.

The rear-stage differential amplification unit 16e shown in FIG. 12 employs capacitive elements C5 and C6. One terminal of the capacitive element C5 is connected to the normal-phase input terminal 27 whereas the other terminal of the capacitive element C5 is connected to the gate electrode of the transistor T34 employed in the load circuit 23. By the same token, one terminal of the capacitive element C6 is connected to the reverse-phase input terminal 28 whereas the other terminal of the capacitive element C6 is connected to the gate electrode of the transistor T35 employed in the load circuit 23.

Effects of the capacitive elements C5 and C6 are explained as follows.

Let notation gm1 denote the transconductances of the transistors T32 and T33 employed in the amplification part 21 included in the rear-stage differential amplification unit 16e, notation gm2 denote the transconductances of the transistors T34 and T35 employed in the load circuit 23 included in the rear-stage differential amplification unit 16e, notation C denote the load capacitance of the load circuit 23, notation t denote the time period of the comparison mode, notation Gr denote the gain of the two-stage amplifier 17 operating in the reset mode and notation Gc denote the gain of the two-stage amplifier 17 operating in the comparison mode. In this case, the gain Gr of the two-stage amplifier 17 operating in the reset mode can be expressed as follows:

$$Gr = gm1/gm2$$

For a short time period t of the comparison mode, the gain Gc of the two-stage amplifier 17 operating in the comparison mode can be expressed as follows:

$$Gc = (gm1 + gm2)/C \cdot t$$

Thus, the input-converted offset can be represented as follows:

$$Vin = Vos \cdot C/((gm2 + gm2/gm1) \cdot t)$$

In a circuit not employing the capacitive elements C5 and C6, the input-converted offset is represented as follows:

$$Vin = Vos \cdot C/(gm2 \cdot t)$$

Thus, by employing the capacitive elements C5 and C6, the effect of the offset reduction can be enhanced by a factor corresponding to the product gm2·gm1.

It is to be noted that a combination of some of the differential amplifiers 16a to 16e shown in FIGS. 8 to 12 respectively can also be used as a rear-stage differential amplifier of the two-stage amplifier 17 employed in the analog/digital converter 1.

Some embodiments have been explained above in detail by referring to accompanying diagrams. However, the embodiments explained above are no more than typical implementations of the present disclosure. That is, the present disclosure can be implemented by mainly the explained embodiments and other embodiments obtained by making a variety of changes and improvements to the explained embodiments on the basis of knowledge of a person skilled in the art.

The present disclosure contains subject matter related to that disclosed in Japanese Priority Patent Application JP 2011-067226 filed in the Japan Patent Office on Mar. 25, 2011, the entire content of which is hereby incorporated by reference.

What is claimed is:

1. A differential amplifier comprising:
an input terminal configured to receive an input signal;
an output terminal configured to output an output signal obtained as a result of amplifying said input signal;
an amplification part configured to amplify said input signal to generate said output signal;
a load circuit which is connected between said amplification part and a power-supply terminal, and is provided with
a first-conduction transistor, and
a changeover switch configured to switch a connection between a gate electrode of said first-conduction transistor and a drain electrode of said first-conduction transistor to a connection between said gate electrode and said output terminal or vice versa; and
a leak cancel switch configured to generate a leak cancel current for reducing an off leak current flowing through said changeover switch.

2. The differential amplifier according to claim 1,
wherein: one terminal of said changeover switch is connected to said gate electrode whereas another terminal of said changeover switch is connected to said drain electrode;
said load circuit has a capacitive element provided between said output terminal and said gate electrode, connects said gate electrode to said drain electrode by closing said changeover switch, and connects said gate electrode to said output terminal by opening said changeover switch; and when said leak cancel switch is sustained in an opened state, a terminal of said leak cancel switch is connected to a terminal of said capacitive element whereas another terminal of said leak cancel switch is connected to the other terminal of said capacitive element, and said leak cancel switch reduces said off leak current of said changeover switch by supplying an off leak current of said leak cancel switch to said gate electrode of said first conduction transistor as said leak cancel current.

3. The differential amplifier according to claim 1, wherein the magnitude of said leak cancel current is equal to or greater than the magnitude of said off leak current of said changeover switch.

4. A differential amplifier comprising:
input terminals configured to receive input signals having normal and reverse phases;
normal-phase and reverse-phase output terminals configured to output output signals obtained as a result of amplifying said input signals;
a first amplification portion configured to amplify said input signal having said normal phase in order to generate said output signal having said reverse phase;
a second amplification portion configured to amplify said input signal having said reverse phase to generate said output signal having said normal phase;
a load circuit provided with
a first transistor connected between said first amplification portion and a power-supply terminal,
a first capacitive element connected between a gate electrode of said first transistor and said normal-phase output terminal,
a first changeover switch to be closed to connect said gate electrode of said first transistor to the source or drain electrode of said first transistor, and to be opened to connect said gate electrode of said first transistor to said normal-phase output terminal,
a second transistor connected between said second amplification portion and said power-supply terminal,
a second capacitive element connected between the gate electrode of said second transistor and said reverse-phase output terminal, and
a second changeover switch to be closed in order to connect said gate electrode of said second transistor to the source or drain electrode of said second transistor or to be opened in order to connect said gate electrode of said second transistor to said reverse-phase output terminal;
a first cancel switch having one of its switch terminals connected to one of the element terminals of said first capacitive element and another switch terminal connected to the other element terminal of said first capacitive element in an opened state; and
a second cancel switch having one of its switch terminals connected to one of the element terminals of said second capacitive element and another switch terminal connected to the other element terminal of said second capacitive element in an opened state.

5. An analog/digital converter comprising
a plurality of amplifiers each configured to amplify a difference between the voltage of an analog signal and each of a plurality of different reference voltages to convert said analog signal into a digital signal,
wherein each of said amplifiers includes:
an input terminal configured to receive an input signal;
an output terminal configured to output an output signal obtained as a result of amplifying said input signal;
an amplification part configured to amplify said input signal to generate said output signal;
a load circuit which is connected between said amplification part and a power-supply terminal, and is provided with
a first-conduction transistor, and
a changeover switch configured to switch a connection between a gate electrode of said first-conduction transistor and a source or drain electrode of said first-conduction transistor to a connection between said gate electrode and said output terminal or vice versa; and
a leak cancel switch configured to generate a leak cancel current which reduces an off leak current flowing through said changeover switch.

* * * * *